(12) United States Patent  
Epple et al.

(10) Patent No.: US 7,203,010 B2
(45) Date of Patent: Apr. 10, 2007

(54) CATADIOPTRIC PROJECTION OBJECTIVE

(75) Inventors: Alexander Epple, Aalen (DE); Aurelian Dodoc, Oberkochen (DE)

(73) Assignee: Carl Zeiss SMT AG, Oberkochen (DE)

(*) Notice: Subject to any disclaimer, the term of this patent is extended or adjusted under 35 U.S.C. 154(b) by 3 days.

(21) Appl. No.: 11/036,155

(22) Filed: Jan. 18, 2005

(65) Prior Publication Data

US 2005/0207029 A1  Sep. 22, 2005

Related U.S. Application Data

(63) Continuation of application No. PCT/EP2003/007758, filed on Jul. 17, 2003.

(60) Provisional application No. 60/396,552, filed on Jul. 18, 2002.

(51) Int. Cl.
*G02B 17/00* (2006.01)

(52) U.S. Cl. .......................... 359/726; 359/727; 355/53

(58) Field of Classification Search ................ 359/726, 359/727, 728, 364, 663; 355/53
See application file for complete search history.

(56) References Cited

U.S. PATENT DOCUMENTS

| | | | |
|---|---|---|---|
| 5,052,764 A | 10/1991 | Moss et al. | |
| 5,742,436 A | 4/1998 | Fuerter | |
| 5,808,805 A | 9/1998 | Takahashi | |
| 5,969,882 A | 10/1999 | Takahashi | |
| 5,999,333 A | 12/1999 | Takahashi | |
| 6,512,641 B2 * | 1/2003 | Omura | 359/727 |
| 6,707,616 B1 | 3/2004 | Takahashi et al. | |
| 2002/0039175 A1 | 4/2002 | Shafer et al. | |
| 2003/0090786 A1 * | 5/2003 | Suenaga et al. | 359/356 |
| 2003/0179356 A1 | 9/2003 | Schuster et al. | |
| 2006/0055907 A1 * | 3/2006 | Kato et al. | 355/67 |

* cited by examiner

*Primary Examiner*—Timothy Thompson
(74) *Attorney, Agent, or Firm*—Sughrue Mion, PLLC

(57) ABSTRACT

A catadioptric projection objective which images a pattern arranged in an object plane of the projection objective into the image plane of the projection objective while generating a real intermediate image has a catadioptric objective part having at least one concave mirror and a beam deflecting device and also a dioptric objective part. The imaging system has a system diaphragm having a variable diaphragm diameter for variably limiting the cross section of the radiation passing through the projection objective. This system diaphragm is arranged in the catadioptric objective part, preferably in direct proximity to the concave mirror. The invention enables a projection objective with a simple construction.

24 Claims, 6 Drawing Sheets

CATADIOPTRIC PROJECTION OBJECTIVE

This application is a continuation application of international patent application PCT/EP2003/007758 filed on Jul. 17, 2003, the disclosure of which is incorporated herein by reference. Priority is claimed from U.S. Provisional Application No. 60/396,552 filed on Jul. 18, 2002, which is also incorporated into this application by reference.

BACKGROUND OF THE INVENTION

1. Field of the Invention

The invention relates to a catadioptric projection objective for imaging a pattern arranged in the object plane of the projection objective into the image plane of the projection objective whilst generating at least one real intermediate image.

2. Description of the Related Art

Projection objectives of this type are used in microlithography projection exposure installations for fabricating semiconductor components and other finely structured devices. They serve for projecting patterns of photomasks or lined plates, generally referred to below as masks or reticles, onto an article coated with a light-sensitive layer with very high resolution on a demagnifying scale.

In this case, the production of ever finer structures necessitates, on the one hand, enlarging the numerical aperture (NA) of the projection objective on the image side and, on the other hand, using ever shorter wavelengths, preferably ultraviolet light having wavelengths of less than approximately 260 nm, for example 248 nm, 193 nm or 157 nm.

For these short wavelengths it becomes more and more difficult to provide purely refractive systems with adequate correction of chromatic aberrations, since the Abbe constants of suitable transparent materials are relatively close together. Therefore, for very high-resolution projection objectives use is made predominantly of catadioptric systems, in which refractive and reflective components, that is to say in particular lenses and mirrors, are combined.

When utilizing imaging mirror surfaces, it is necessary to use beam deflecting devices if obscuration-free and vignetting-free imaging is to be achieved. There are systems with geometrical beam deflection, in which the beam deflecting device has at least one fully reflective deflection mirror. Systems with physical beam deflection are also known, for example systems with a physical beam splitter in the form of a beam splitter cube (BSC). Although systems without an intermediate image are available, use is increasingly being made of projection objectives with an intermediate image, which permit greater structural freedoms with regard to the type and arrangement of lenses and other optical components.

The projection objectives are usually equipped with a system diaphragm for limiting the cross section of the radiation passing through the projection objective. The diaphragm diameter of the system diaphragm can preferably be set in a variable manner in order to be able to set, for a given application, the best compromise between numerical aperture or resolution, on the one hand, and depth of focus (DOF), on the other hand.

Such a system diaphragm, also called aperture diaphragm or aperture stop, is fitted in the vicinity of a suitable diaphragm location of the optical axis. Suitable diaphragm locations lie at or in the vicinity of axial positions in which the principal ray of the optical imaging intercepts the optical axis. Imaging systems with an intermediate image have two such diaphragm locations, namely one between object plane and intermediate image and one between the intermediate image and the image plane.

In known catadioptric projection objectives with an intermediate image, the system diaphragm is fitted within the dioptric objective part at the diaphragm location lying in the vicinity of the image plane. Examples of such systems are shown, inter alia, in EP 0 869 383 (corresponding to U.S. Pat. No. 5,969,882), U.S. Pat. No. 6,157,498 or U.S. Pat. No. 5,808,805 or the associated continuation application U.S. Pat. No. 5,999,333.

U.S. Pat. No. 5,052,764 shows a catadioptric projection objective in which the edge of the concave mirror serves as system diaphragm for limiting the usable numerical aperture. The diaphragm diameter is defined by the mirror diameter.

SUMMARY OF THE INVENTION

It is one object of the invention to provide a catadioptric projection objective of the type mentioned in the introduction with a favorable construction.

As a solution to this and other objects this invention, according to one formulation, provides a catadioptric projection objective for imaging a pattern arranged in the object plane of the projection objective into the image plane of the projection objective whilst generating at least one real intermediate image, having a catadioptric objective part having at least one concave mirror and a beam deflecting device; a dioptric objective part; and a system diaphragm having a variable diaphragm diameter for limiting the cross section of the radiation passing through the projection objective, the system diaphragm being arranged in the catadioptric objective part.

Advantageous embodiments are specified in dependent claims. The wording of all the claims is made by reference to the contents of the description.

A catadioptric projection objective according to the invention has a catadioptric objective part and a dioptric objective part. The catadioptric objective part comprises at least one concave mirror and a beam deflecting device. The dioptric objective part is of purely refractive construction and has no imaging mirrors. The imaging system has a system diaphragm having a variable diaphragm diameter for limiting the cross section of the radiation passing through the projection objective. This system diaphragm is arranged in the catadioptric objective part.

In many variants of catadioptric projection objectives with an intermediate image, the catadioptric objective part has relatively few lenses and other optical components which are often arranged at relatively large distance from one another. This affords favorable possibilities for fitting system diaphragms having a variable diaphragm diameter. If the system diaphragm is accommodated in the catadioptric objective part, it is not necessary to configure the dioptric objective part such that a sufficient distance for fitting a variable system diaphragm remains between suitable lenses. The invention thus provides structural freedoms in the refractive or dioptric objective part. The lenses of this objective part can thus be positioned and configured optimally with regard to their intended optical effect.

It is possible for the catadioptric objective part to be that objective part which directly precedes the image plane. In some embodiments, the catadioptric objective part serves for generating an intermediate image from the radiation coming from the object plane and the dioptric object part serves for imaging the intermediate image into the image plane. In such systems, in particular the system diaphragm may be arranged between the object plane and the intermediate image.

Particular embodiments are distinguished by the fact that the system diaphragm is arranged in the vicinity of the concave mirror. In this case, the system diaphragm may be seated so near to the concave mirror that a distance between the vertex of the concave mirror (corresponding to the point of intersection between the mirror area and the optical axis) and the position of the system diaphragm is less than 50% of the maximum diaphragm diameter. In one embodiment, an arrangement near the concave mirror is promoted by virtue of the fact that the system diaphragm is arranged in a clearance directly adjacent to the concave mirror. Consequently, no lens nor any other optical component is situated between the system diaphragm and the concave mirror in this case. Fitting as near as possible to the concave mirror helps to reduce or avoid possible vignettings thorugh the system diaphragm.

The system diaphragm may be a planar system diaphragm in which the diaphragm edge remains in one plane independently of the diaphragm diameter set. It is particularly favorable if the system diaphragm has a diaphragm edge, which determines the diaphragm diameter and whose axial position can be altered with regard to the optical axis of the projection objective as a function of the diaphragm diameter. This permits optimum adaptation of the effective diaphragm position to the beam course in a manner dependent on the diaphragm diameter.

In the case of a system diaphragm having a variable diaphragm diameter which is arranged in the vicinity of the concave mirror, said system diaphragm may be designed in such a way that the diaphragm edge of the system diaphragm can be moved in the event of adjustment of the diaphragm diameter along a curved area which is adapted to the contour of the mirror area of the concave mirror. The curved area may be e.g. an area which is rotationally symmetrical with respect to the optical axis. A distance—measured parallel to the optical axis—between the mirror area and the diaphragm edge, for each diaphragm position, should preferably be as small as possible in order to avoid vignettings. By way of example, the system diaphragm may be designed as a spherical diaphragm in which the diaphragm edge can be moved in the event of adjustment of the diaphragm diameter along a spherical area or an ellipsoidal area. The curvature thereof should be well adapted to the curvature of the concave mirror. It is also possible to design the system diaphragm as a conical diaphragm, so that the diaphragm edge runs along a cone envelope area in the event of adjustment of the diaphragm diameter. A linear dependence of the axial position of the diaphragm edge on the diaphragm diameter results in this case.

Favorable embodiments of system diaphragms are ones in which an axial distance between the diaphragm edge and the mirror area of the concave mirror for each diaphragm diameter is less than 50%, in particular less than 30% or less than 20%, of the corresponding axial distance between the mirror area and a plane defined by the edge of the concave mirror. The smaller the distance between mirror area and diaphragm edge, the lower the variation of the aperture on the objective side over the field. This variation should be minimized in order ideally to obtain a constant aperture on the objective side over the entire field.

In some embodiments, the system diaphragm is an elliptical diaphragm with an elliptical diaphragm edge. In this case, the diaphragm diameter is dependent on the diameter direction running perpendicularly to the optical axis. The ellipticity of a diaphragm can be utilized to reduce or avoid vignetting effects when stopping down. As an alternative or in addition to the measures described above, the diaphragm ellipticity may be used for reducing the vignetting (e.g. spherical diaphragms). Embodiments of system diaphragms with an elliptical diaphragm edge which have an ellipticity which can be altered as a function of the diaphragm diameter are particularly favorable. The term ellipticity here denotes the ratio of the largest diameter and smallest diameter of a diaphragm. In these diaphragms, the ratio of the largest diameter and smallest diameter is not constant, but rather is dependent on the diaphragm position. Such diaphragms permit an optimum pupil shape to be set for each diaphragm setting.

Generally, in systems of the type mentioned here, the telecentry of the system will change depending on the diaphragm diameter set. In order to obtain the least possible change in telecentry when stopping up or down, it is favorable if the diaphragm location which is associated with the system diaphragm and at which the principal ray of the imaging intersects the optical axis lies as near as possible to the mirror area of the concave mirror. It is favorable if said diaphragm location lies between a plane defined by the edge of the concave mirror and the vertex of the concave mirror. If an axial distance between the vertex and the diaphragm location is at most approximately 20% of the mirror radius with the diaphragm maximally open, the influence of the diaphragm adjustment on telecentry can be kept particularly small. This distance between mirror area and diaphragm location is also referred to as principal ray deviation.

It is possible for the system diaphragm assigned to the catadioptric objective part to be the sole beam limiting diaphragm of the imaging system. There are also embodiments in which, in addition to the system diaphragm assigned to the catadioptric objective part, a further system diaphragm is arranged in the region of a conjugate diaphragm location in the dioptric objective part. This system diaphragm may have a fixedly predetermined, invariable diaphragm diameter or an adjustable diaphragm diameter. Such an additional diaphragm can increase the degrees of freedom in the construction of said variable diaphragm.

The invention can be utilized both in the case of catadioptric projection objectives with geometrical beam splitting, and in the case of catadioptric projection objectives with physical beam splitting.

The above and further features emerge not only from the claims but also from the description and the drawings, in which case the individual features may be realized, and may represent advantageous embodiments protectable per se, in each case on their own or as a plurality in the form of subcombinations in embodiments of the invention and in other fields.

DETAILED DESCRIPTION OF THE PREFERRED EMBODIMENTS

In the following description of preferred embodiments, the term "optical axis" denotes a straight line or a sequence of straight line sections through the centers of curvature of the optical components. The optical axis is folded at deflection mirrors or other reflective surfaces. Directions and distances are described as "on the image side" if they are directed in the direction of the image plane or of the substrate to be exposed that is situated there, and as "on the object side" if they are directed with regard to the optical axis with respect to the object plane or a reticle situated there. In the examples, the object is a mask (reticle) having the pattern of an integrated circuit; a different pattern, for example of a grating, may also be involved.

In the examples, the image is projected onto a wafer which is provided with a photoresist layer and serves as substrate. Other substrates, for example elements for liquid crystal displays or substrates for optical gratings, are also possible.

The plane which is spanned by the folded optical axis and contains the optical axis and the principal ray of the beam is referred to as the meridional plane or meridional section. The sagittal plane or the sagittal section contains the principal ray of the beam and is perpendicular to the meridional plane.

Figure 1:
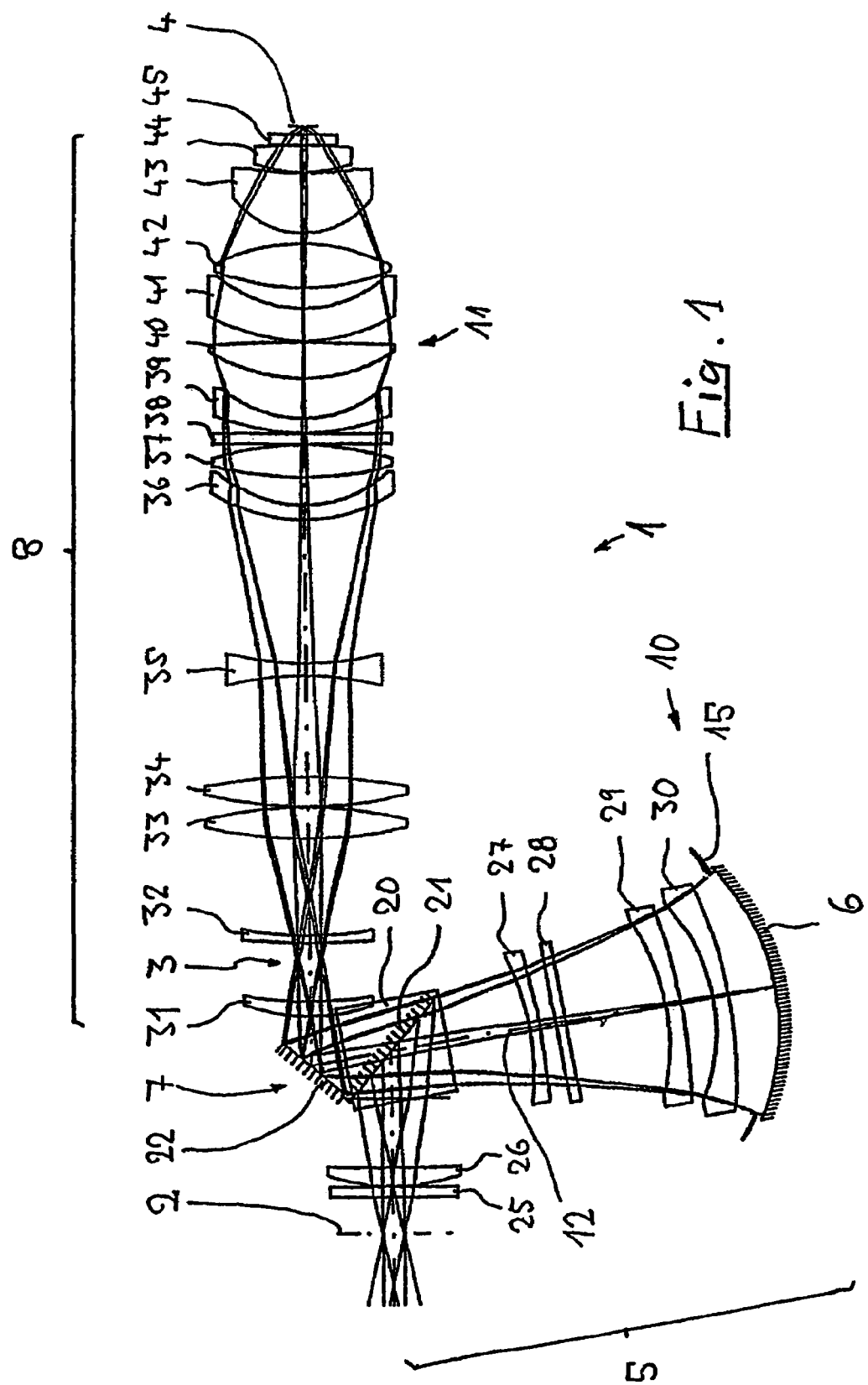
FIG. 1 is a lens section through an embodiment of a catadioptric projection objective with a physical beam splitter and system diaphragm in the vicinity of the concave mirror.

FIG. 1 shows an embodiment of a catadioptric reduction objective 1 according to the invention with physical beam splitting. It serves to image a pattern of a reticle or the like arranged in an object plane 2 into an image planes 4 lying parallel to the object plane 2 whilst generating a single real intermediate image 3 on a reduced scale, for example in the ratio 4:1. The objective 1 has, between the object plane 2 and the image plane 4, a catadioptric objective part 5 having a concave mirror 6 and a beam deflecting device 7, and a dioptric objective part 8, which follows the catadioptric objective part and contains exclusively refractive optical components.

Since the reduction objective generates a real intermediate image 3, two real pupil planes 10, 11 are present, namely a first pupil plane 10 in the catadioptric objective part 5 directly in front of the concave mirror 6 and a second pupil plane 11 in the region of the largest beam diameter in the dioptric objective part 8 in the vicinity of the image plane 4. In the regions of the pupil planes 10, 11, the principal ray of the imaging crosses the optical axis 12 of the system. The pupil planes 10, 11 are optically conjugate diaphragm locations with respect to one another, i.e. preferred locations in the region of which a physical diaphragm for limiting the beam cross-section can be fitted.

In the embodiment shown, a system diaphragm 15 is fitted directly in front of the concave mirror 6 in the catadioptric objective part 5. The system diaphragm 15 has a diaphragm diameter that can be set variably for variably limiting the cross section of the radiation passing through the projection objective, so that the actually used numerical aperture of the projection objective can be set by setting the diaphragm diameter. No separate diaphragm or beam cross-section limiting is provided at the conjugate diaphragm location 11. Such a diaphragm may be provided in other embodiments.

The beam deflecting device 7 comprises a physical beam splitter with a beam splitter cube 20, in which a polarization-selective beam splitter surface 21 is arranged diagonally. The planar beam splitter surface 21 oriented obliquely with respect to the optical axis 12 serves for deflecting correspondingly linearly polarized object light to the concave mirror 6 and is designed in such a way that light coming from the concave mirror 6 is transmitted to a deflection mirror 22 with a direction of polarization rotated through 90°, the planar mirror surface of said deflection mirror being oriented perpendicularly to the beam splitter surface 21. Whereas the beam splitter surface 21 is necessary for deflecting the object light in the direction of the concave mirror 6, the deflection mirror 22 may also be omitted. In that case, without further deflection mirrors, the object plane and the image plane would be essentially perpendicular to one another. The parallel position of object plane 2 and image plane 4 achieved by the deflection mirror 22 is favorable, for example, for a scanner operation of the projection exposure installation comprising the projection objective.

The light from an illumination system (not shown) enters the projection objective on the image-remote side of the object plane 2 and firstly passes through the mask arranged in the object plane. The transmitted light then passes through a plane-parallel plate 25 and a positive lens 26, which focuses the radiation and thus enables relatively small diameters of the beam splitter cube 20. The linear polarization of the input light is oriented such that the beam splitter surface 21 has a reflective action for the light, so that the input light is deflected in the direction of the concave mirror 6. In accordance with the arrangement of the concave mirror in an oblique horizontal arm of the projection objective, the deflection angle is more than 90°, for example 103 to 105°. In the horizontal arm, the light firstly impinges on a negative meniscus lens 27. Arranged behind the latter there may be a polarization rotation device in the form of a λ/4 plate 28, which converts the entering, linearly polarized light into circularly polarized light. The latter passes through two negative meniscus lenses 29, 30 placed directly in front of the concave mirror 6 before it impinges on the concave mirror 6 after passing through the system diaphragm 15. The light which is reflected from the concave mirror 6 and guided back through the doubly traversed lenses 27 to 30 in the direction of the beam deflecting device 7 is converted by the λ/4 plate into light having linear polarization which is transmitted by the beam splitter surface 21 in the direction of the deflection mirror 22. The light reflected from the deflection mirror 22 forms the intermediate image 3 after passing through a positive meniscus lens 31. Said intermediate image is imaged into the image plane 4 by the subsequent lenses 32 to 45 of the refractive objective part 8, which, overall, have a demagnifying action.

What is evident as a special feature of this objective part is that a positive lens 40 is seated at the conjugate diaphragm location 11 with respect to the location of the system diaphragm 15, so that this location would not be suitable for fitting an adjustable system diaphragm. By virtue of the arrangement of the system diaphragm 15 in the catadioptric objective part 5, however, there is no need to consider the positioning of a diaphragm in the construction of the dioptric objective part 8, so that less stringent design which is optimal from optical standpoints is possible in this region.

The specification of the design is summarized in tabular form in Table 1. Here, column 1 specifies the number of the refractive surface, reflective surface or surface distinguished in some other way, column 2 specifies the radius r of the surface (in mm), column 3 specifies the distance d—designated as thickness—between the surface and the subsequent surface (in mm), column 4 specifies the material of a component, and column 5 specifies the refractive index of the material of the component which follows the entry surface specified. Column 6 specifies the optically usable half free diameters of the optical components (in mm). The reflective surfaces are indicated in column 7. The structural length L of the objective between object and image plane is approximately 1120 mm.

In the embodiment, eight of the surfaces, namely the surfaces indicated by "AS" in the second column, are aspherical. Table 2 specifies the corresponding aspherical data, the sagittas of the aspherical surface being calculated according to the following prescription:

$$p(h)=[((1/r)h^2)/(1+SQRT(1-(1+K)(1/r)^2h^2))]+C1*h^4+C2*h^6+$$

In this case, the reciprocal (1/r) of the radius specifies the surface curvature at the surface vertex and h specifies the distance between a surface point and the optical axis. Consequently, p(h) specifies this sagitta, i.e. the distance between the surface point and the area vertex in the z direction, i.e. in the direction of the optical axis. The constants K, C1, C2 . . . are reproduced in Table 2.

The optical system 1 which can be reproduced with the aid of these specifications is designed for an operating wavelength of approximately 157 nm, at which the lens material used for all the lenses, calcium fluoride, has a refractive index of n=1.55841. The numerical aperture NA on the image side is 0.85, and the imaging scale is 4:1. The system is designed for an image field having a size of 26×5.5 mm². The system is doubly telecentric.

Figure 2:
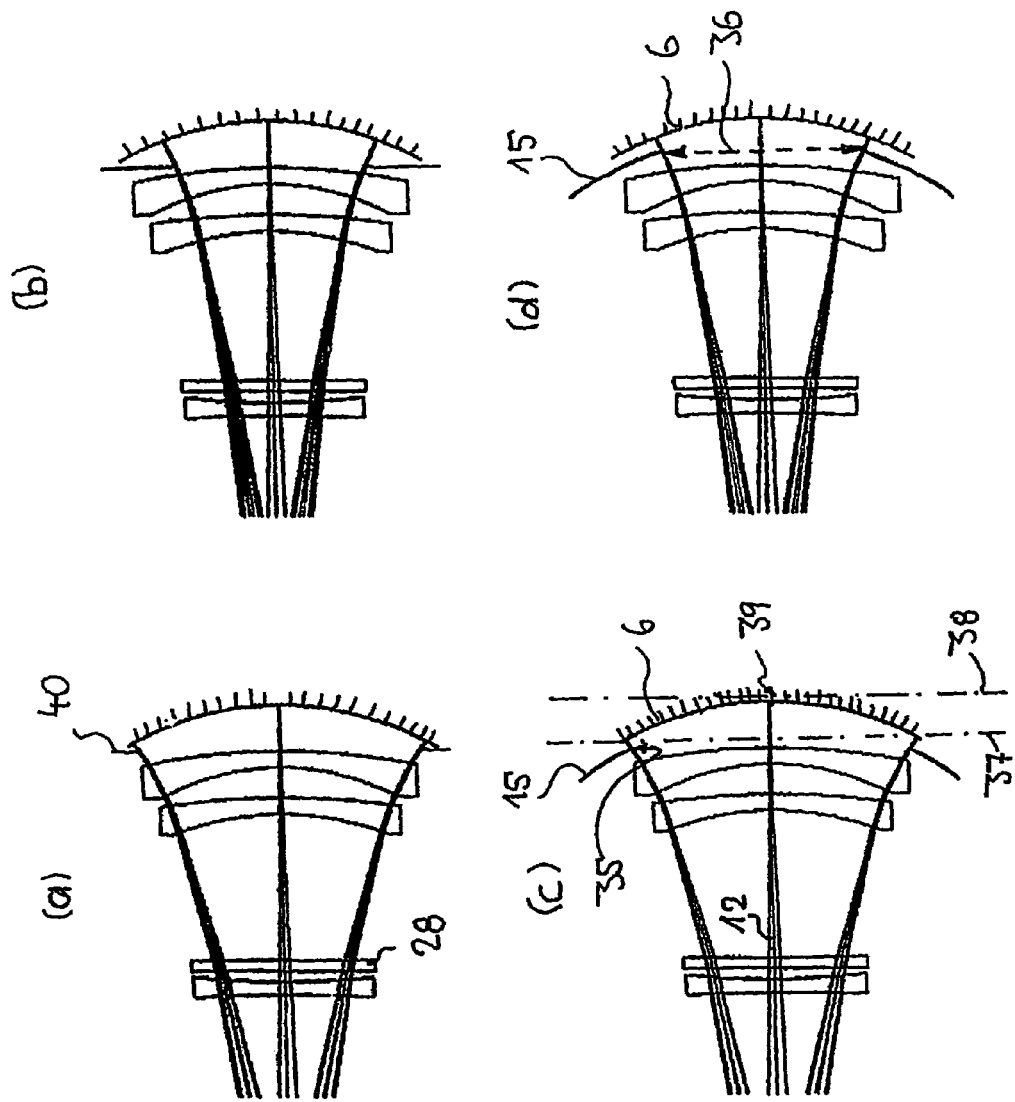
FIG. 2 is an illustration showing a comparison between a planar diaphragm (FIGS. 2(a) and (b)) and a spherical diaphragm (FIGS. (c) and (d)) in the fully open and stopped-down state.
Figure 3:
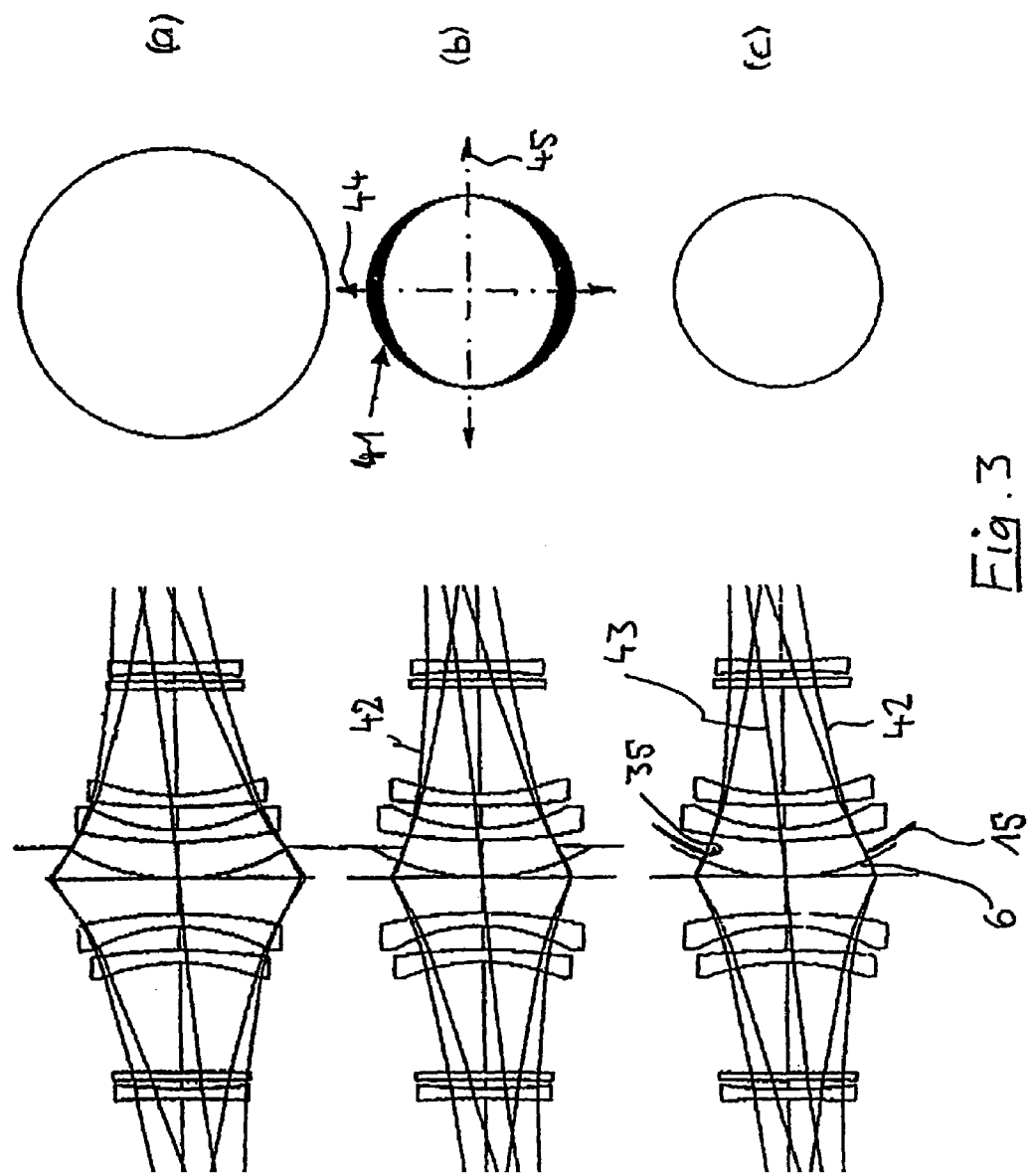
FIG. 3 is a diagrammatic illustration showing the influence of the diaphragm shape on the illumination of the projection objective in the region of the pupil.

Special features of the system diaphragm 15 will be explained in more detail with reference to FIGS. 2 and 3. The system diaphragm 15 fitted in a clearance directly adjoining the concave mirror 6 is designed as a "spherical diaphragm" (FIGS. 2(c) and (d)). It has an inner diaphragm edge 35, which defines the diaphragm diameter 36 and whose axial position can be altered with regard to the optical axis 12 as a function of the diaphragm diameter. In this case, the effective diaphragm position defined by the diaphragm edge 35 moves when stopping down, i.e. when reducing the diaphragm diameter, in the direction of the concave mirror. During this adjustment of the diaphragm diameter, the diaphragm edge moves on a rotational area adapted to the contour of the mirror area, namely on a spherical area. While the diaphragm edge 35, with the diaphragm fully open (FIG. 2(c)), still lies outside the concave mirror, i.e. in front of the front mirror plane 37 defined by the edge of the mirror, the diaphragm edge, in the event of a reduction of the diaphragm diameter (FIG. 2(d)), is shifted in the direction of the rear mirror plane 38, which runs through the vertex 39 of the mirror perpendicularly to the optical axis 12.

For comparison, FIGS. 2(a) and (b) show a planar system diaphragm in which the diaphragm edge, when stopping up and down, remains in a diaphragm plane 40 lying outside the concave mirror, i.e. in front of the front mirror plane of the concave mirror.

The effects of the various diaphragm shapes on the shape of the illuminated pupil of the system will be explained with reference to FIG. 3. In this case, FIGS. 3(a) to (c) respectively show, on the left, an extended meridional section of the projection objective in the region of the concave mirror and respectively show, on the right, the corresponding shape of the system pupil for an object point at the field edge.

FIG. 3(a) shows a system having a planar system diaphragm with the diaphragm fully open. In this case, the full numerical aperture of the system is utilized and the illuminated pupil has a circular shape with a maximum diameter.

FIG. 3(b) shows the same system having a planar system diaphragm and a smaller diaphragm diameter. The reduction of the diaphragm diameter results in a corresponding reduction in the diameter of the illuminated pupil. In addition to the diameter reduction, a meridional vignetting 41, indicated in black on the right in FIG. 3(b), is manifested, said vignetting resulting from the fact that marginal rays 42 of the beam which run in the meridional plane in the vicinity of the diaphragm edge are partly vignetted by the diaphragm and thus cannot contribute to the pupil illumination. The outermost rays 42 of the beam at the diaphragm edge are also referred to as rim rays. They form the marginal rays of the field edge pencil. The vignetting effect is understandable if it is taken into consideration that when the system diaphragm is arranged directly in front of the concave mirror 6, the diaphragm plane is traversed twice by the light. In this case, rays which run in the meridional plane obliquely with respect to the optical axis and additionally traverse the system diaphragm near to the diaphragm edge on their way to the concave mirror partly fall upon the diaphragm elements of the system diaphragm from the mirror side on their way back after reflection at the concave mirror and are thereby masked out. Consequently some of the marginal rays in the meridional plane no longer contribute to the illumination of the pupil, resulting in the meridional vignetting 42.

It is evident that the principal ray 43 of the imaging intersects the optical axis 12 very near to the mirror vertex (point of intersection between the mirror area and the optical axis), so that only a small principal ray deviation is present. A small principal ray deviation, which should preferably be no more than 20% of the maximum diaphragm radius, is favorable for avoiding telecentric errors when stopping down.

Vignetting has the effect that the numerical aperture on the image side is smaller in the meridional direction 44 than in the sagittal direction 45 running perpendicular thereto. This promotes so-called variations in the critical dimensions (CD variations), which are also referred to as H-V differences. Such a direction dependence of the imaging properties can arise if the resolving power of the projection objective is direction-dependent. In example 2 (FIG. 3(b)), the resolving power for lines which run essentially perpendicularly to the meridional plane (meridional structures) would be lower, on account of the smaller numerical aperture, than the resolving power for the sagittal structures running parallel to the meridional plane. Such CD variations should be avoided or kept within tolerable limits. In particular, the effective numerical aperture for different structural directions should be essentially identical for all the structural directions and it should change essentially by the same amount when the diameter of the diaphragm is adjusted for all the structural directions.

The abovementioned problems are reduced or avoided when using a spherical diaphragm 15 (FIG. 3(c)). In the case of the latter, the diaphragm edge 35 can always be arranged at a very short distance in front of the mirror area independently of the diaphragm position or of the diaphragm diameter, so that the rays reflected by the concave mirror "see", even in the meridional edge region, essentially the same diaphragm openings as the rays falling upon the concave mirror.

What is thereby achieved is that the illuminated pupil always remains essentially circular independently of the diaphragm diameter set, this applying in particular even with a partly or fully stopped-down diaphragm (FIG. 3(c)). Consequently, in this case, the numerical aperture in the meridional direction ($NA_{merid}$), for every diaphragm setting, has essentially exactly the same magnitude as the numerical aperture in the sagittal direction ($NA_{sag}$). The ellipticity factor k=$NA_{merid}/NA_{sag}$ correspondingly represents a measure of the uniformity or nonuniformity of the shape of the pupil illumination. Values of k in the vicinity of or at the value 1 are generally sought.

Figure 4:
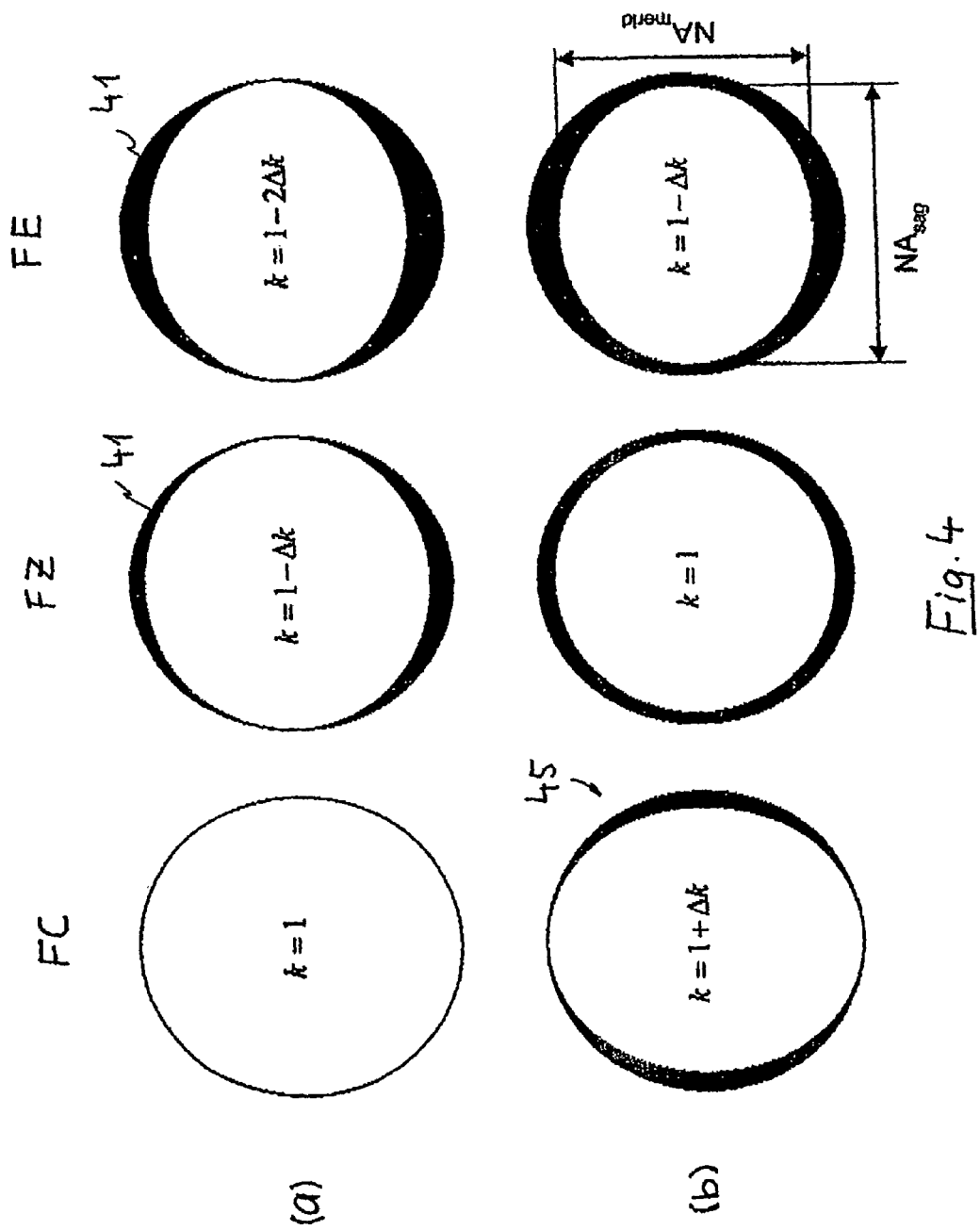
FIG. 4 is a diagrammatic illustration for explaining the influence of the ellipticity of a system diaphragm on the vignetting of the pupil at different field points.

A different possibility for influencing the ellipticity factor k through the configuration of the diaphragm shape of the system diaphragm will be described with reference to FIG. 4. In one embodiment, the system diaphragm is designed as a diaphragm having an elliptical diaphragm edge ("elliptical diaphragm"), in which, in particular, the diaphragm diameters may differ in the sagittal direction and in the meridional direction. In order to explain the mode of operation of such a diaphragm, FIG. 4 diagrammatically shows alterations in the vignetting of the pupil in the case of a diaphragm setting with a minimal numerical aperture for different field points in the field center (left-hand column, FC), in the field zone between field center and field edge (FZ, middle column) and at the field edge (FE, right-hand column), the upper row (a) of the imaging showing the pupil shapes for a planar system diaphragm with an annular diaphragm opening and the lower row (b) showing the pupil shape for a planar system diaphragm with an elliptical diaphragm opening. The upper row (a) reveals that the pupil appears circular from the point of view of the field center (FC) (k=1). The further away the field point considered is from the center of the field, the more pronounced the meridional vignetting 41 is manifested, which is also evident in FIG. 3(b). In this case, the deviation from the ideal ellipticity factor k=1 is represented by way of example by an arbitrary value Δk, which, in the example, is chosen such that the deviation from k=1 is twice as high at the field edge as at the field point considered in the field zone.

The lower row (b) explains the influence of using an elliptical diaphragm on the ratio of the numerical apertures in the meridional direction and sagittal direction. In the case of the example, the different diameters of the diaphragm opening are chosen such that the diaphragm diameter in the sagittal direction is less than that in the meridional direction. Accordingly, considered from the field center, the pupil appears with slight sagittal vignetting 45, in the case of which $NA_{sag}$ is less than $NA_{merid}$. Correspondingly, the ellipticity factor is k>1. If a field point in the field zone is then considered (lower row, middle picture), then what can be achieved is that the meridional vignetting, which essentially results from the axial distance between diaphragm edge and mirror surface, and the sagittal vignetting, which is produced by the ellipticity of the diaphragm opening, largely or completely compensate for one another. An essentially round pupil illumination (k=1) can be achieved as a result. In proceeding further to the field edge, the influence of the meridional vignetting is predominant, so that the numerical aperture in the meridional direction is now less than that in the sagittal direction. A comparison of the pictures in the right-hand column makes it clear that the difference in the numerical apertures in both perpendicular directions, considered over all the field points, is significantly smaller in the case of an elliptical diaphragm than in the case of a circular planar diaphragm.

The value Δk (see FIG. 4) may be chosen e.g. to an approximation as follows:

$$\Delta k = 2 \cdot \frac{y' \cdot NA}{D_{B1}^2} \cdot d$$

where y' denotes the half diameter of the image field, NA denotes the numerical aperture (at the image), $D_{B1}$ denotes the diameter of the diaphragm and d denotes the distance between the diaphragm edge at minimum NA and the mirror area measured parallel to the optical axis.

It is clear from this exemplary explanation that targeted setting of the ellipticity of the diaphragm opening, for each application, makes it possible to find an optimum compromise enabling a relatively uniform pupil illumination for all the field points (mediation). Since the extent of the meridional vignetting, which results from the axial distance between diaphragm edge and mirror area, depends on the diaphragm diameter and increases as the diaphragm diameter decreases, in the embodiment explained here the ellipticity of the diaphragm is not constant, but rather can be altered as a function of the diaphragm diameter.

An elliptical system diaphragm of the type explained by way of example may, as an alternative to a spherical diaphragm or conical diaphragm, reduce the problems explained in the context of vignetting to a tolerable extent.

Figure 5:
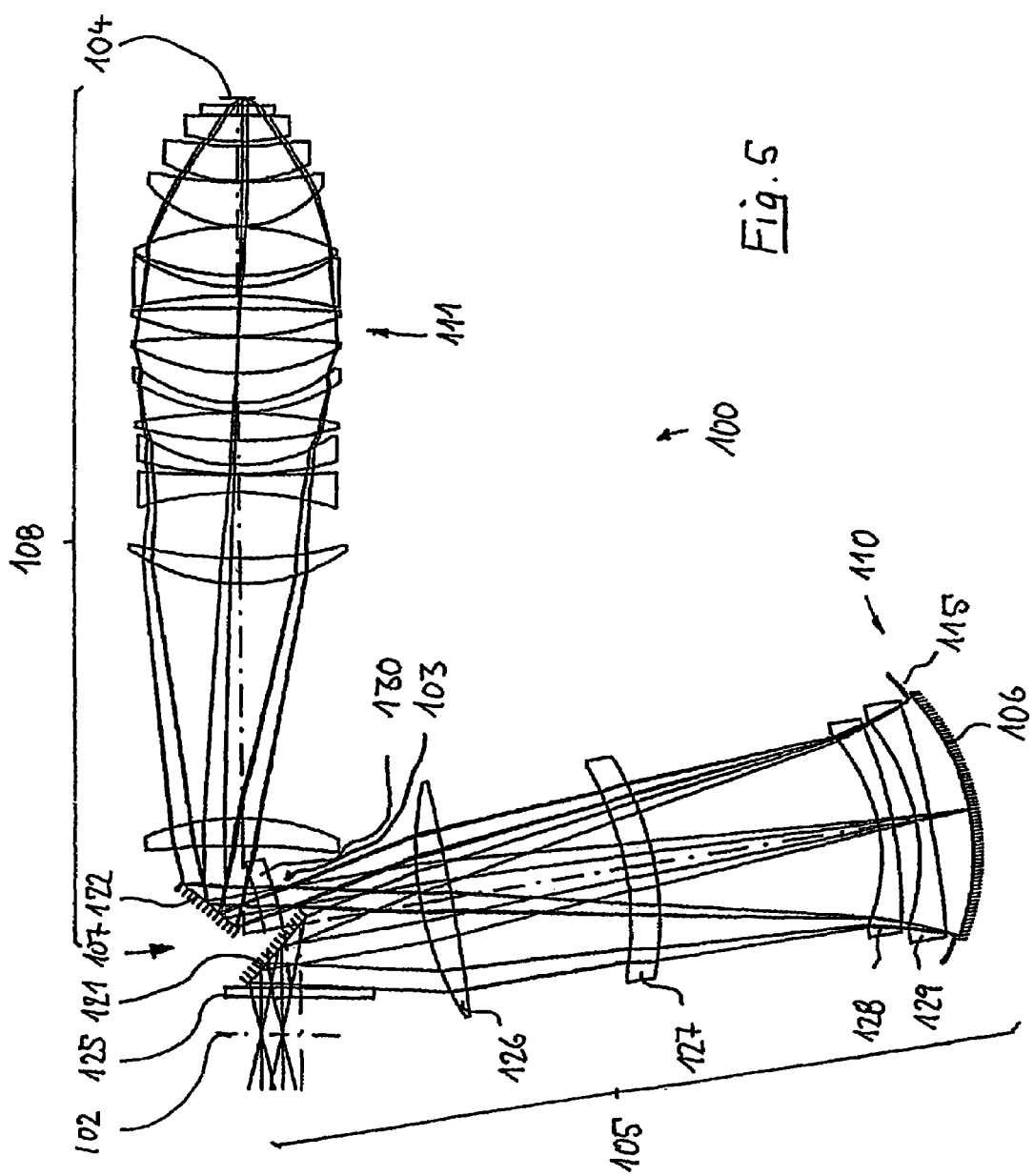
FIG. 5 is a lens section through an embodiment of a catadioptric projection objective with a geometrical beam splitter and system diaphragm in the vicinity of the concave mirror.

An exemplary embodiment of a catadioptric projection objective 110 with geometrical beam splitting is explained with reference to FIG. 5. The specification in Tables 3 and 4 is provided for the embodiment. Here the beam deflecting device 107 has a fully reflective, planar deflection mirror 121, which deflects the light coming from the object plane 102 in the direction of the concave mirror 106 with a deflection angle of somewhat more than 100°. A second deflection mirror 122, which is not necessary optically and whose mirror suface is perpendicular to that of the mirror 121, directs the radiation reflected from the concave mirror 106 in the direction of the image plane 104, which is parallel to the object plane. In this embodiment, the intermediate image 103 lying between the catadioptric objective part 105 and the dioptric objective part 108 arises at a distance in front of the second deflection mirror 122, weak negative refractive power being arranged between the intermediate image and this deflection mirror. In this intermediate image system, a pupil surface suitable as a diaphragm location likewise lies in direct proximity in front of the concave mirror 106, while an optically conjugate pupil plane 111 with respect thereto is seated in the refractive objective part 108. The system diaphragm 115 is again designed as a spherical diaphragm which, with regard to its construction and function, may be identical or similar to the spherical system diaphragm 15 in the embodiment shown in FIG. 1. Reference is expressly made to the description thereof.

In this embodiment, the light coming from the object plane, after passing through a plane-parallel entry plate 125 of the objective, falls directly upon the deflection mirror 121. The space between object plane and first mirror surface is thus free of refractive power. The light reflected from the deflection mirror 121 passes through a biconvex positive lens 126 and then a meniscus lens 127 with weak negative refractive power situated at a distance behind the latter. The light, which has been brought to a relatively small beam diameter through these lenses, after passing through two large negative meniscus lenses 128, 129, impinges on the concave mirror 106. On the return path from the mirror 106 to the intermediate image, the lenses 129, 128, 127, 126 are traversed again. The lenses are designed in such a way that the intermediate image 3 lies in direct proximity to the first deflection mirror 121 beside the latter. The dioptric objective part 108, which begins at the negative meniscus lens 130 following the intermediate image 103 and comprises the second deflection mirror 122, images the intermediate image onto the image plane 104 on a demagnifying scale.

In the embodiments described, all the transparent optical components are composed of the same material, namely calcium fluoride. It is also possible to use other materials which are transparent at the operating wavelength, in particular fluoride crystal materials such as barium fluoride, lithium fluoride, magnesium fluoride, lithium-calcium-aluminum fluoride, lithium-strontium-aluminum fluoride or the like. If appropriate, it is also possible to use at least one second material in order, by way of example, to support the chromatic correction. The advantages of the invention can also be used in systems for other operating wavelengths of the ultraviolet region, for example for 248 nm or 193 nm. In particular in systems for longer wavelengths than 157 nm, it is also possible to use other lens materials, for example synthetic quartz glass, for all or some of the optical components.

The advantages of the invention can be used independently of what folding geometry is set with the aid of the beam deflecting device and, if appropriate further mirror sufaces. In particular, systems are also possible in which the light coming from the object plane initially impinges on the concave mirror in order to be reflected from the latter in the direction of a first mirror surface of the beam deflecting device.

Figure 6:
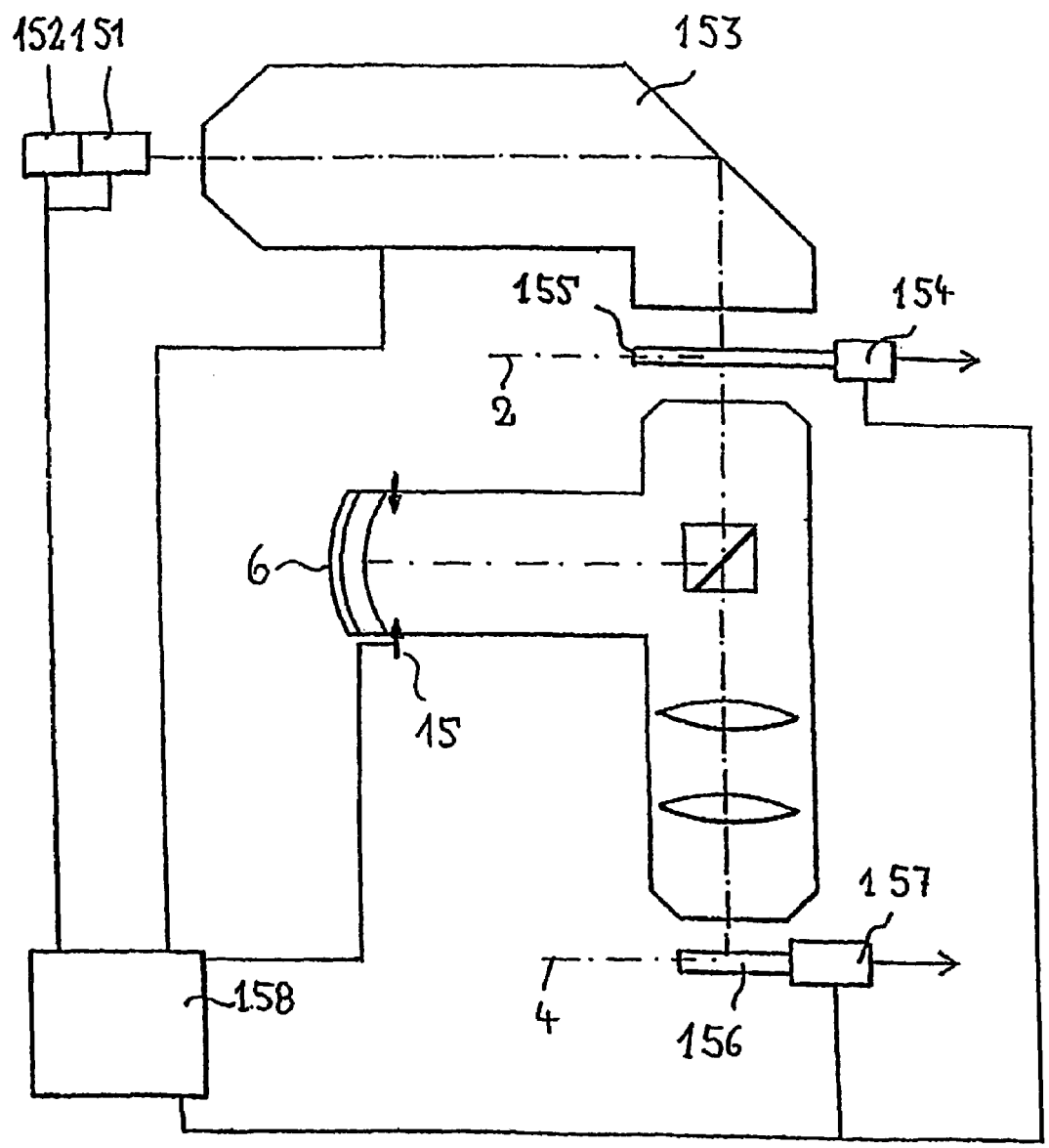
FIG. 6 is a diagrammatic illustration of a microlithography projection exposure installation with an embodiment of a projection objective according to the invention.

Projection objectives according to the invention can be used in all suitable microlithographic projection exposure installations, for example in a wafer stepper or a wafer scanner. A wafer scanner 150 is shown diagrammatically by way of example in FIG. 6. It comprises a laser light source 151 with an assigned device 152 for narrowing the bandwidth of the laser. An illumination system 153 generates a large, sharply delimited and very homogeneously illuminated image field which is adapted to the telecentry requirements of the downstream projection objective 1. The illumination system 153 has devices for selecting the illumination mode and can be changed over for example between conventional illumination with a variable degree of coherence, annular field illumination and dipole or quadrupole illumination. Arranged behind the illumination system is a device 154 for holding and manipulating a mask 155 in such a way that the mask 155 lies in the object plane 2 of the projection objective 1 and can be moved in this plane for scanning operation. The device 154 correspondingly comprises the scanning drive in the case of the wafer scanner shown.

The mask plane 2 is followed by the reduction objective 1, which images an image of the mask on a reduced scale on a wafer 156, which is coated with a photoresist layer and is arranged in the image plane 4 of the reduction objective 1. The wafer 156 is held by a device 157 comprising a scanner drive in order to move the wafer synchronously with the reticle. All the systems are controlled by a control unit 158. The control unit also controls the adjustable system diaphragm 15, which is arranged directly in front of the concave mirror 6 in the catadioptric part of the projection objective.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The contents of all the claims is made part of this description by reference

| i157c: Surface | Radii | Thicknesses | Glasses | Refractive Index 157.63 nm | ½ Free Diameter | |
|---|---|---|---|---|---|---|
| 0 | 0.000000000 | 38.000000000 | | 1.00000000 | 53.151 | |
| 1 | 0.000000000 | 0.000000000 | | 1.00000000 | 61.263 | |
| 2 | 0.000000000 | 10.000000000 | CAF2HL | 1.55840983 | 61.263 | |
| 3 | 0.000000000 | 1.300000000 | | 1.00000000 | 62.619 | |
| 4 | 213.377354631 | 18.655698423 | CAF2HL | 1.55840983 | 65.076 | |
| 5 | 3463.270616530 | 70.000000000 | | 1.00000000 | 65.214 | |
| 6 | 0.000000000 | 48.000000000 | CAF2HL | 1.55840983 | 67.638 | |
| 7 | 0.000000000 | −57.000000000 | CAF2HL | −1.55840983 | 76.858 | REFL |
| 8 | 0.000000000 | −85.068951709 | | −1.00000000 | 70.072 | |
| 9 | 250.105887575 | −10.000000000 | CAF2HL | −1.55840983 | 72.838 | |
| 10 | 621.764367088AS | −16.659949654 | | −1.00000000 | 75.081 | |
| 11 | 0.000000000 | −10.000000000 | CAF2HL | −1.55840983 | 78.318 | |
| 12 | 0.000000000 | −99.764995587 | | −1.00000000 | 79.323 | |
| 13 | 233.022421027 | −15.000000000 | CAF2HL | −1.55840983 | 92.111 | |
| 14 | 611.708072957 | −31.848707905 | | −1.00000000 | 98.676 | |
| 15 | 195.858166502 | −15.000000000 | CAF2HL | −1.55840983 | 102.075 | |
| 16 | 513.065279678AS | 0.000000000 | | −1.00000000 | 114.103 | |
| 17 | 0.000000000 | −46.371220046 | | −1.00000000 | 121.125 | |
| 18 | 243.354420253 | 46.371220046 | | 1.00000000 | 127.257 | REFL |
| 19 | 0.000000000 | 0.000000000 | | 1.00000000 | 121.154 | |
| 20 | 513.065279678AS | 15.000000000 | CAF2HL | 1.55840983 | 114.160 | |
| 21 | 195.858166502 | 31.848707905 | | 1.00000000 | 102.098 | |
| 22 | 611.708072957 | 15.000000000 | CAF2HL | 1.55840983 | 98.684 | |
| 23 | 233.022421027 | 99.764995587 | | 1.00000000 | 92.095 | |

-continued

| i157c: Surface | Radii | Thicknesses | Glasses | Refractive Index 157.63 nm | 1/2 Free Diameter | |
|---|---|---|---|---|---|---|
| 24 | 0.000000000 | 10.000000000 | CAF2HL | 1.55840983 | 79.173 | |
| 25 | 0.000000000 | 16.659949654 | | 1.00000000 | 78.157 | |
| 26 | 621.764367088AS | 10.000000000 | CAF2HL | 1.55840983 | 74.890 | |
| 27 | 250.105887575 | 85.068951709 | | 1.00000000 | 72.636 | |
| 28 | 0.000000000 | 105.000000000 | CAF2HL | 1.55840983 | 69.714 | |
| 29 | 0.000000000 | 36.835344000 | | 1.00000000 | 67.142 | |
| 30 | 0.000000000 | −50.000000000 | | −1.00000000 | 66.465 | REFL |
| 31 | −189.944625150 | −15.067723382 | CAF2HL | −1.55840983 | 63.556 | |
| 32 | −395.557905635 | −22.926953816 | | −1.00000000 | 62.217 | |
| 33 | 0.000000000 | −36.495041046 | | −1.00000000 | 59.669 | |
| 34 | −574.635215078AS | −8.000000000 | CAF2HL | −1.55840983 | 63.074 | |
| 35 | −357.840432275 | −100.597704253 | | −1.00000000 | 64.435 | |
| 36 | −430.181406850 | −32.512186323 | CAF2HL | −1.55840983 | 97.850 | |
| 37 | 401.374741135AS | −0.800000000 | | −1.00000000 | 98.821 | |
| 38 | −413.067277740 | −30.658485495 | CAF2HL | −1.55840983 | 99.649 | |
| 39 | 540.050532522 | −103.816279460 | | −1.00000000 | 99.022 | |
| 40 | 311.137219667 | −12.500000000 | CAF2HL | −1.55840983 | 76.566 | |
| 41 | −325.472840128AS | −147.114634308 | | −1.00000000 | 75.266 | |
| 42 | −170.296899764 | −15.000000000 | CAF2HL | −1.55840983 | 89.611 | |
| 43 | −129.709212614 | −28.284188191 | | −1.00000000 | 86.046 | |
| 44 | −374.108574799 | −32.687735103 | CAF2HL | −1.55840983 | 87.684 | |
| 45 | 302.499942640 | −0.800000000 | | −1.00000000 | 88.379 | |
| 46 | 0.000000000 | −10.000000000 | CAF2HL | −1.55840983 | 87.672 | |
| 47 | 0.000000000 | −0.800000000 | | −1.00000000 | 87.349 | |
| 48 | −219.190097303AS | −15.000000000 | CAF2HL | −1.55840983 | 86.496 | |
| 49 | −128.002707621 | −39.823871446 | | −1.00000000 | 81.833 | |
| 50 | −180.388659298 | −35.363556527 | CAF2HL | −1.55840983 | 90.778 | |
| 51 | 2015.270614630 | −1.622797796 | | −1.00000000 | 91.047 | |
| 52 | −181.666955367AS | −32.266616786 | CAF2HL | −1.55840983 | 91.650 | |
| 53 | −131.287483607 | −20.385588383 | | −1.00000000 | 85.048 | |
| 54 | −246.296724592 | −43.977881105 | CAF2HL | −1.55840983 | 86.149 | |
| 55 | 199.279517554 | −10.706330366 | | −1.00000000 | 86.210 | |
| 56 | −89.282477887 | −59.601350677 | CAF2HL | −1.55840983 | 68.384 | |
| 57 | −333.587150719 | −0.800000000 | | −1.00000000 | 50.891 | |
| 58 | −139.373857880AS | −26.454133325 | CAF2HL | −1.55840983 | 47.138 | |
| 59 | 848.095494291 | −1.300000000 | | −1.00000000 | 35.895 | |
| 60 | 0.000000000 | −10.000000000 | CAF2HL | −1.55840983 | 32.573 | |
| 61 | 0.000000000 | −7.999999938 | | −1.00000000 | 26.087 | |
| 62 | 0.000000000 | 0.000000000 | | −1.00000000 | 13.288 | |

TABLE 2

Aspherical Constants

| Surface No. 10 | | Surface No. 16 | |
|---|---|---|---|
| K | 0.0000 | K | 0.0000 |
| C1 | −2.27966332e−008 | C1 | 1.03702388e−008 |
| C2 | 5.05302225e−014 | C2 | −1.55772168e−013 |
| C3 | 8.89868447e−018 | C3 | 5.02117966e−019 |
| C4 | 3.05066069e−021 | C4 | −9.79126548e−023 |
| C5 | 5.90965879e−027 | C5 | −5.05372218e−027 |

| Surface No. 20 | | Surface No. 26 | |
|---|---|---|---|
| K | 0.0000 | K | 0.0000 |
| C1 | 1.03702388e−008 | C1 | −2.27968332e−008 |
| C2 | −1.55772168e−013 | C2 | 5.05302225e−014 |
| C3 | 5.02117966e−019 | C3 | 8.89868447e−018 |
| C4 | −9.79126548e−023 | C4 | 3.05066069e−021 |
| C5 | −5.05372218e−027 | C5 | 5.90965879e−027 |

| Surface No. 34 | | Surface No. 37 | |
|---|---|---|---|
| K | 0.0000 | K | 0.0000 |
| C1 | 3.88123973e−008 | C1 | −3.37440835e−009 |
| C2 | 3.66892582e−013 | C2 | −7.83428664e−014 |
| C3 | 6.01750956e−018 | C3 | −4.14952440e−018 |
| C4 | −1.83127643e−021 | C4 | −2.40906122e−023 |
| C5 | 1.48444363e−025 | C5 | 1.24017876e−027 |

TABLE 2-continued

Aspherical Constants

| Surface No. 41 | | Surface No. 48 | |
|---|---|---|---|
| K | 0.0000 | K | 0.0000 |
| C1 | −1.90477655e−008 | C1 | 3.25677302e−008 |
| C2 | −1.12074262e−013 | C2 | 6.36561317e−013 |
| C3 | 2.13619148e−017 | C3 | −8.73547510e−017 |
| C4 | 6.72051143e−022 | C4 | −3.12620264e−021 |
| C5 | 3.22313039e−026 | C5 | −5.90867670e−025 |

| Surface No. 52 | | Surface No. 58 | |
|---|---|---|---|
| K | 0.0000 | K | 0.0000 |
| C1 | 2.89312052e−008 | C1 | 9.87782163e−008 |
| C2 | −8.17185219e−013 | C2 | 2.54249850e−011 |
| C3 | −1.28836694e−017 | C3 | 1.89610758e−015 |
| C4 | 3.16314089e−021 | C4 | 8.98606617e−019 |
| C5 | 2.06415363e−025 | C5 | −2.26026407e−022 |

TABLE 3

| i144c Surface | Radii | Thicknesses | Glasses | Refractive Index 157.63 nm | ½ Free Diameter | |
|---|---|---|---|---|---|---|
| 0 | 0.000000000 | 38.000000000 | | 1.00000000 | 67.000 | |
| 1 | 0.000000000 | 0.000000000 | | 1.00000000 | 73.666 | |
| 2 | 0.000000000 | 10.000000000 | CAF2HL | 1.55840983 | 73.666 | |
| 3 | 0.000000000 | 1.000000000 | | 1.00000000 | 74.809 | |
| 4 | 0.000000000 | 0.000000000 | CAF2HL | 1.55840983 | 74.991 | |
| 5 | 0.000000000 | 69.000000000 | | 1.00000000 | 74.991 | |
| 6 | 0.000000000 | 0.000000000 | | −1.00000000 | 97.962 | REFL |
| 7 | 0.000000000 | −133.256225567 | | −1.00000000 | 87.927 | |
| 8 | −334.921046039 | −35.267341307 | CAF2HL | −1.55840983 | 118.931 | |
| 9 | 2316.860956260 | −191.219078418 | | −1.00000000 | 118.801 | |
| 10 | 334.342495746 | −30.050000000 | CAF2HL | −1.55840983 | 111.147 | |
| 11 | 331.806620086AS | −240.948491244 | | −1.00000000 | 114.132 | |
| 12 | 202.137904312 | −15.000000000 | CAF2HL | −1.55840983 | 108.097 | |
| 13 | 603.561607731AS | −24.412676132 | | −1.00000000 | 115.108 | |
| 14 | 243.675143124 | −15.000000000 | CAF2HL | −1.55640983 | 116.494 | |
| 15 | 1154.941673280 | −0.918201278 | | −1.00000000 | 128.215 | |
| 16 | 0.000000000 | −40.186129375 | | −1.00000000 | 131.752 | |
| 17 | 270.496348347 | 40.186129375 | | 1.00000000 | 133.841 | REFL |
| 18 | 0.000000000 | 0.918201278 | | 1.00000000 | 130.448 | |
| 19 | 1154.941673280 | 15.000000000 | CAF2HL | 1.55840983 | 126.638 | |
| 20 | 243.675143124 | −24.412676132 | | 1.00000000 | 114.340 | |
| 21 | 603.561607731AS | 15.000000000 | CAF2HL | 1.55840983 | 112.513 | |
| 22 | 202.137904312 | 240.948491244 | | 1.00000000 | 104.958 | |
| 23 | 331.806620086AS | 30.050000000 | CAF2HL | 1.55840983 | 98.846 | |
| 24 | 334.342495746 | 191.219078418 | | 1.00000000 | 95.429 | |
| 25 | 2316.860956260 | 35.267341307 | CAF2HL | 1.55840983 | 94.137 | |
| 26 | −334.921046039 | 81.574848968 | | 1.00000000 | 93.872 | |
| 27 | 0.000000000 | 70.543166887 | | 1.00000000 | 76.095 | |
| 26 | 434.359810853AS | 19.669209579 | CAF2HL | 1.55840983 | 70.324 | |
| 29 | 581.572177344 | 20.958737710 | | 1.00000000 | 71.510 | |
| 30 | 0.000000000 | 0.000000000 | | −1.00000000 | 96.442 | REFL |
| 31 | 0.000000000 | −95.288025243 | | −1.00000000 | 74.412 | |
| 32 | 732.237850915 | −30.050000000 | CAF2HL | −1.55840983 | 90.983 | |
| 33 | 253.465219339AS | −260.435685940 | | −1.00000000 | 93.860 | |
| 34 | −194.407953218 | −27.875797137 | CAF2HL | −1.55840983 | 107.139 | |
| 35 | −433.150616791 | −72.434694568 | | −1.00000000 | 105.444 | |
| 36 | 328.073329188 | −19.259018689 | CAF2HL | −1.55840983 | 98.300 | |
| 37 | 2795.645402450AS | −1.300000000 | | −1.00000000 | 98.869 | |
| 38 | −393.103502192 | −10.050000000 | CAF2HL | −1.55840983 | 99.561 | |
| 39 | −173.119989553 | −26.442901342 | | −1.00000000 | 98.021 | |
| 40 | −405.470242398 | −30.480520660 | CAF2HL | −1.55840983 | 101.220 | |
| 41 | 531.996711870 | −1.300000000 | | −1.00000000 | 102.133 | |
| 42 | −187.648685552AS | −10.050000000 | CAF2HL | −1.55840983 | 105.331 | |
| 43 | −160.236098480 | −32.309783314 | | −1.00000000 | 102.572 | |
| 44 | −223.584217604 | −39.005680186 | CAF2HL | −1.55840983 | 107.515 | |
| 45 | 1183.731369990 | −1.810861371 | | −1.00000000 | 107.069 | |
| 46 | −293.439839744 | −30.057090282 | CAF2HL | −1.55840983 | 106.251 | |
| 47 | 2024.087750160 | −13.213998179 | | −1.00000000 | 105.238 | |
| 48 | 507.203837253AS | −10.242139035 | CAF2HL | −1.55540983 | 104.201 | |
| 49 | −164.733166387 | −12.041498982 | | −1.00000000 | 100.788 | |
| 50 | −254.529370901 | −52.319406068 | CAF2HL | −1.55840983 | 101.799 | |
| 51 | 243.218961834 | −1.300000000 | | −1.00000000 | 101.939 | |
| 52 | −118.536987218 | −46.776482352 | CAF2HL | −1.55840983 | 86.683 | |
| 53 | −391.543172110 | −1.878723392 | | −1.00000000 | 78.238 | |
| 54 | −170.253181949 | −36.457900142 | CAF2HL | −1.55840983 | 71.418 | |
| 55 | −353.989959970 | −5.067955195 | | −1.00000000 | 56.097 | |
| 56 | −212.335190959AS | −27.278840192 | CAF2HL | −1.55840983 | 49.939 | |
| 57 | 2000.000000000 | −1.300000000 | | −1.00000000 | 36.729 | |
| 58 | 0.000000000 | −10.000000000 | CAF2HL | −1.55840983 | 34.191 | |
| 59 | 0.000000000 | −7.999970061 | | −1.00000000 | 28.058 | |
| 60 | 0.000000000 | −0.000029951 | | −1.00000000 | 16.750 | |

TABLE 4

Aspherical Constants

| | Surface No. 11 | | Surface No. 13 |
|---|---|---|---|
| K | 0.0000 | K | 0.0000 |
| C1 | −4.53876585e−009 | C1 | 9.71696054e−009 |
| C2 | 3.61286939e−014 | C2 | −1.37395424e−013 |

TABLE 4-continued

Aspherical Constants

| C3 | 1.64926639e−018 | C3 | 1.51465444e−018 |
|---|---|---|---|
| C4 | −8.05644847e−023 | C4 | −4.93816650e−023 |
| C5 | 8.02279102e−028 | C5 | −3.88693908e−027 |

| Surface No. 21 | Surface No. 23 |
|---|---|

TABLE 4-continued

Aspherical Constants

| | | | |
|---|---|---|---|
| K | 0.0000 | K | 0.0000 |
| C1 | 9.71696054e−009 | C1 | −4.53876585e−009 |
| C2 | −1.37395424e−013 | C2 | 3.61286939e−014 |
| C3 | 1.51465444e−018 | C3 | 1.64926639e−018 |
| C4 | −4.93816650e−023 | C4 | −8.05644847e−023 |
| C5 | −3.88693908e−027 | C5 | 8.02279102e−028 |

| Surface No. 28 | | Surface No. 33 | |
|---|---|---|---|
| K | 0.0000 | K | 0.0000 |
| C1 | −2.00067915e−008 | C1 | 5.22266043e−009 |
| C2 | −3.91079059e−013 | C2 | 1.73072312e−013 |
| C3 | −1.22648763e−017 | C3 | 2.61317180e−018 |
| C4 | 4.51019392e−022 | C4 | 1.51040454e−023 |
| C5 | −5.54574007e−026 | C5 | 4.16542228e−027 |

| Surface No. 37 | | Surface No. 42 | |
|---|---|---|---|
| K | 0.0000 | K | 0.0000 |
| C1 | −8.25732400e−009 | C1 | 1.34299838e−008 |
| C2 | 8.95171321e−014 | C2 | 1.79144333e−014 |
| C3 | 7.40906720e−018 | C3 | 1.34023310e−018 |
| C4 | 3.49460240e−023 | C4 | −7.03332410e−023 |
| C5 | −2.38736168e−026 | C5 | −2.21261316e−026 |

| Surface No. 48 | | Surface No. 56 | |
|---|---|---|---|
| K | 0.0000 | K | 0.0000 |
| C1 | 1.35269540e−008 | C1 | 3.11525358e−008 |
| C2 | −6.37958242e−013 | C2 | 1.07391878e−011 |
| C3 | 2.25276268e−017 | C3 | 2.04164763e−015 |
| C4 | −1.26184101e−021 | C4 | −1.30051888e−019 |
| C5 | 3.54519041e−026 | C5 | −1.61070803e−023 |

The invention claimed is:

1. A catadioptric projection objective for imaging a pattern arranged in the object plane of the projection objective into the image plane of the projection objective while generating at least one real intermediate image, comprising:
a catadioptric objective part having at least one concave mirror and a beam deflecting device;
a dioptric objective part; and
a system diaphragm having a variable diaphragm diameter for limiting a cross section of radiation passing through the projection objective,
the system diaphragm being arranged in the catadioptric objective part.

2. The projection objective according to claim 1, wherein the catadioptric objective part is designed for generating the intermediate image and the dioptric objective part is designed for imaging the intermediate image into the image plane.

3. The projection objective according to claim 1, wherein the system diaphragm is arranged between the object plane and the intermediate image.

4. The projection objective according to claim 1, wherein a distance between a vertex of the concave mirror and the position of the system diaphragm is less than 50% of the maximum diaphragm diameter.

5. The projection objective according to claim 1, wherein the system diaphragm is arranged in a clearance directly adjacent to the concave mirror.

6. The projection objective according to claim 1, wherein the system diaphragm has a diaphragm edge, which determines the diaphragm diameter and whose axial position with regard to the optical axis of the projection objective is being altered as a function of the diaphragm diameter.

7. The projection objective according to claim 1, wherein a system diaphragm having a variable diaphragm diameter which is arranged in the vicinity of the concave mirror is designed in such a way that a diaphragm edge of the system diaphragm is moved in the event of adjustment of the diaphragm diameter along a curved surface which is adapted to the contour of the mirror surface of the concave mirror.

8. The projection objective according to claim 7, wherein the curved surface is a surface which is rotationally symmetrical with respect to the optical axis.

9. The projection objective according to claim 1, wherein the system diaphragm is designed as a spherical diaphragm in which the diaphragm edge is moved in the event of adjustment of the diaphragm diameter along a spherical surface or an ellipsoidal surface.

10. The projection objective according to claim 1, wherein the system diaphragm is designed as a conical diaphragm in which a diaphragm edge is moved in the event of adjustment of the diaphragm diameter on a cone envelope surface.

11. The projection objective according to claim 1, wherein the system diaphragm has a diaphragm edge and wherein an axial distance between the diaphragm edge and the mirror surface of the concave mirror, for each diaphragm diameter, is less than 50% of a corresponding axial distance between the mirror surface and a plane defined by the edge of the concave mirror.

12. The projection objective according to claim 1, wherein an effective diaphragm plane defined by a diaphragm edge is arranged, in the case of at least one diaphragm position, between a plane defined by the edge of the concave mirror and the vertex of the concave mirror.

13. The projection objective according to claim 1, wherein the system diaphragm is a diaphragm having an elliptical diaphragm edge.

14. The projection objective according to claim 13, wherein the system diaphragm has an ellipticity which is altered as a function of the diaphragm diameter.

15. The projection objective according to claim 1, wherein a principal ray of the imaging intersects the optical axis between a plane defined by an edge of the concave mirror and a vertex of the concave mirror.

16. The projection objective according to claim 15, wherein an axial distance between the vertex of the concave mirror and the diaphragm location is at most approximately 20% of a mirror radius of the concave mirror with a maximally open diaphragm.

17. The projection objective according to claim 1, wherein, in addition to the system diaphragm assigned to the catadioptric objective part, a further system diaphragm is arranged in the region of a conjugate diaphragm location with respect to the location of said system diaphragm in the dioptric objective part.

18. The projection objective according to claim 1, wherein the beam deflecting device has a physical beam splitter having at least one polarization-selectively effective beam splitter surface.

19. The projection objective according to claim 1, wherein the beam deflecting device has at least one fully reflective deflection mirror for reflecting light coming from the object plane in the direction of the concave mirror or for reflecting light coming from the concave mirror in the direction of the image plane.

20. A projection exposure apparatus for microlithography having an illumination system and a catadioptric projection objective for imaging a pattern arranged in the object plane of the projection objective into the image plane of the projection objective while generating at least one real intermediate image, the projection objective comprising:
a catadioptric objective part having at least one concave mirror and a beam deflecting device;
a dioptric objective part; and
a system diaphragm having a variable diaphragm diameter for limiting a cross section of radiation passing through the projection objective,
the system diaphragm being arranged in the catadioptric objective part.

21. A method for fabricating semiconductor components and other finely structured devices, comprising:
providing a mask with a predetermined pattern;
illuminating the mask with ultraviolet light having a predetermined wavelength; and
projecting an image of the pattern onto a light-sensitive substrate arranged in the region of the image plane of a projection objective with the aid of a catadioptric projection objective for imaging a pattern arranged in the object plane of the projection objective into the image plane of the projection objective while generating at least one real intermediate image, the projection objective comprising:
a catadioptric objective part having at least one concave mirror and a beam deflecting device;
a dioptric objective part; and
a system diaphragm having a variable diaphragm diameter for limiting a cross section of radiation passing through the projection objective,
the system diaphragm being arranged in the catadioptric objective part.

22. A catadioptric projection objective for imaging a pattern arranged in the object plane of the projection objective into the image plane of the projection objective while generating at least one real intermediate image, comprising:
a catadioptric objective part having at least one concave mirror;
a dioptric objective part; and
a system diaphragm having a variable diaphragm diameter for limiting a cross section of radiation passing through the projection objective,
the system diaphragm being arranged in the catadioptric objective part.

23. The projection objective according to claim 22, wherein the system diaphragm is arranged in the vicinity of the concave mirror where a distance between a vertex of the concave mirror and the position of the system diaphragm is less than 50% of the maximum diaphragm diameter.

24. The projection objective according to claim 23, wherein the system diaphragm having a variable diaphragm diameter which is arranged in the vicinity of the concave mirror is designed in such a way that a diaphragm edge of the system diaphragm is moved in the event of adjustment of the diaphragm diameter along a curved surface which is adapted to the contour of the mirror surface of the concave mirror, wherein the curved surface is a surface which is rotationally symmetrical with respect to the optical axis.

* * * * *